United States Patent
Park et al.

(10) Patent No.: US 11,223,448 B2
(45) Date of Patent: Jan. 11, 2022

(54) METHOD AND APPARATUS FOR DECODING USING SOFT DECISION

(71) Applicant: ELECTRONICS AND TELECOMMUNICATIONS RESEARCH INSTITUTE, Daejeon (KR)

(72) Inventors: Ok Sun Park, Daejeon (KR); Gi Yoon Park, Daejeon (KR); Seok Ki Kim, Daejeon (KR); Woo Ram Shin, Daejeon (KR); Tae Joong Kim, Daejeon (KR); Jae Sheung Shin, Sejong-si (KR); Young Ha Lee, Daejeon (KR)

(73) Assignee: ELECTRONICS AND TELECOMMUNICATIONS RESEARCH INSTITUTE, Daejeon (KR)

(*) Notice: Subject to any disclaimer, the term of this patent is extended or adjusted under 35 U.S.C. 154(b) by 0 days.

(21) Appl. No.: 17/159,543

(22) Filed: Jan. 27, 2021

(65) Prior Publication Data
US 2021/0297181 A1  Sep. 23, 2021

(51) Int. Cl.
  *H04L 1/00*  (2006.01)
(52) U.S. Cl.
  CPC .......... *H04L 1/0057* (2013.01); *H04L 1/0047* (2013.01); *H04L 1/0061* (2013.01)

(58) Field of Classification Search
  CPC ... H04L 1/0057; H04L 1/0061; H04L 1/0047; H03M 13/1102
  See application file for complete search history.

(56) References Cited

U.S. PATENT DOCUMENTS

| 2012/0060071 A1* | 3/2012 | Shin ................. H03M 13/2927 714/755 |
| 2013/0287148 A1 | 10/2013 | Kwon et al. |
| 2013/0290815 A1 | 10/2013 | Kim et al. |
| 2014/0053049 A1 | 2/2014 | Chen et al. |
| 2018/0358983 A1 | 12/2018 | Kim et al. |
| 2019/0036550 A1* | 1/2019 | Koike-Akino ..... H03M 13/1108 |
| 2020/0228237 A1 | 7/2020 | Myung et al. |

FOREIGN PATENT DOCUMENTS

| WO | 2009075508 A1 | 6/2009 |
| WO | 2015023140 A1 | 2/2015 |
| WO | 2019031925 A1 | 2/2019 |

* cited by examiner

*Primary Examiner* — Sung S Ahn
(74) *Attorney, Agent, or Firm* — LRK Patent Law Firm

(57) ABSTRACT

An operation method of a first communication node in a communication system includes receiving a signal from a second communication node; demodulating the signal to obtain LLR values; calculating a first codeword based on the LLR values; selecting error patterns from among all error patterns based on Hamming weights; generating second codewords by applying the first codeword to each of the selected error patterns; and determining a codeword having a highest similarity to the first codeword among the second codewords as an optimal codeword.

13 Claims, 10 Drawing Sheets

FIG. 10

Total numbers of error pattens to be processed

| | (127,50,13) | (127,36,15) | |
|---|---|---|---|
| | R=0.39 | R=0.28 | |
| OSD(2) | 1,275 | 666 | OSD |
| OSD(3) | 20,875 | 7,806 | |
| OSD(1,2) | 546 | 289 | Segmentation-based OSD |
| OSD(1,3) | 5,506 | 2,060 | |
| OSD(2,2) | 699 | 367 | |
| JOSD(1,2,1,1) | 1,122 | 588 | Joint OSD |
| JOSD(1,3,1,1) | 6,082 | 2,359 | |
| JOSD(2,2,1,1) | 1,275 | 666 | |

METHOD AND APPARATUS FOR DECODING USING SOFT DECISION

CROSS-REFERENCE TO RELATED APPLICATIONS

This application claims priority to Korean Patent Application No. 10-2020-0032837 filed on Mar. 17, 2020 with the Korean Intellectual Property Office (KIPO), the entire contents of which are hereby incorporated by reference.

BACKGROUND

1. Technical Field

The present disclosure relates generally to a method and an apparatus for decoding using soft decision, and more specifically, to a method and an apparatus for decoding data by using soft decision in a communication system.

2. Description of Related Art

In a communication system, when a communication node transmits data to another communication node on a radio channel, errors may occur in the data depending on a state of the radio channel. Therefore, in order for the communication node to accurately detect the received data, a high-performance decoding technique may be required. In general, in large data communication, a coding and decoding scheme optimized for long code blocks may be used, and in massive machine type communications or ultra-reliable and low-latency communications, a coding and decoding scheme optimized for short code blocks may be used. Usually, the shorter the length of the code block, the worse the error correction and recovery performance may be due to PPV bounds.

The low density parity check code (LDPC) code uses a relatively simple belief propagation (BP) decoding scheme, but performance may not be excellent when a length of a code block is short. The polar code shows improved performance when a length of a code block is short by using a CRC aided-successive cancellation list (CA-SCL) decoding scheme, but there is a problem in that complexity increases as the size of the list increases. The Bose-Chaudhuri-Hocquenghem (BCH) code, which is a linear block code, may obtain better performance than the conventional LDPC code and polar code by using a high-order ordered statistics decoding (OSD) scheme, but there is a problem in that the complexity increases significantly as the order increases. Currently, a coding and decoding scheme showing improved performance and low complexity is required in performing coding and decoding on a code block having a short length.

SUMMARY

Accordingly, exemplary embodiments of the present disclosure are directed to providing a decoding method and a decoding apparatus having high reliability and low complexity for a short code block by efficiently selecting error patterns.

According to an exemplary embodiment of the present disclosure, an operation method of a first communication node in a communication system may comprise: receiving a signal from a second communication node; demodulating the signal to obtain log-likelihood ratio (LLR) values; calculating a first codeword based on the LLR values; selecting error patterns from among all error patterns based on Hamming weights; generating second codewords by applying the first codeword to each of the selected error patterns; and determining a codeword having a highest similarity to the first codeword among the second codewords as an optimal codeword.

The calculating of the first codeword may comprise: selecting LLR values greater than or equal to a threshold among the LLR values; and determining a first codeword by performing hard-decision on the selected LLR values.

The selecting of the error patterns may comprise: dividing the selected LLR values into Q blocks; selecting first error patterns having Hamming weights equal to or less than a first Hamming weight #q, for each arbitrary block #q among the Q blocks; and generating a first error pattern set by performing a union operation on the first error patterns selected for each block #q, wherein each of Q and q is a natural number.

The first Hamming weight #q in the block #q may be less than or equal to a first Hamming weight #q+1 in a block #q+1 adjacent to the block #q.

The operation method may further comprise: selecting second error patterns existing commonly in a plurality of blocks including the block #q, and generating a second error pattern set based on the second error patterns; and generating a third error pattern set by performing a union operation on the first error pattern set and the second error pattern set, wherein the second error patterns have a second Hamming weight #q.

The second Hamming weight #q in the block #q may be less than or equal to a second Hamming weight #q+1 in a block #q+1 adjacent to the block #q.

The determining of the first codeword may comprise: calculating a similarity #k between the first codeword and a codeword #k included in the second codewords; calculating a similarity #k+1 between the first codeword and a codeword #k+1 included in the second codewords; and comparing the similarity #k and the similarity #k+1 to determine a codeword having a higher similarity as an optimal codeword, wherein k is a natural number.

The similarity between the codewords may be determined based on a degree of discrepancy between the codewords or a degree of correlation between the codewords.

According to another exemplary embodiment of the present disclosure, a first communication node in a communication system may comprise a processor; a memory electronically communicating with the processor; and instructions stored in the memory, wherein when executed by the processor, the instructions may cause the first communication node to: receive a signal from a second communication node; demodulate the signal to obtain LLR values; calculate a first codeword based on the LLR values; select error patterns from among all error patterns based on Hamming weights; generate second codewords by applying the first codeword to each of the selected error patterns; and determine a codeword having a highest similarity to the first codeword among the second codewords as an optimal codeword.

In the calculating of the first codeword, the instructions may further cause the first communication node to: select LLR values greater than or equal to a threshold among the LLR values; and determine a first codeword by performing hard-decision on the selected LLR values.

In the selecting of the error patterns, the instructions may further cause the first communication node to: divide the selected LLR values into Q blocks; select first error patterns having Hamming weights equal to or less than a first hamming weight #q, for each arbitrary block #q among the Q blocks; and generate a first error pattern set by performing a union operation on the first error patterns selected for each block #q, wherein each of Q and q is a natural number.

The first Hamming weight #q in the block #q may be less than or equal to a first Hamming weight #q+1 in a block #q+1 adjacent to the block #q.

The instructions may further cause the first communication node to: select second error patterns existing commonly in a plurality of blocks including the block #q, and generate a second error pattern set based on the second error patterns; and generate a third error pattern set by performing a union operation on the first error pattern set and the second error pattern set, wherein the second error patterns have a second Hamming weight #q.

According to the exemplary embodiments of the present disclosure, the communication node may reduce communication overhead and efficiently overcome errors in the signal decoding process by performing decoding based on selected error patterns. In addition, the communication node may lower a signal-to-interference-plus-noise-ratio (SINR) required to achieve ultra-high reliability performance, and realize large scale Internet of things (IoT) communications or high-reliability/low-latency communications required in the 5th generation (5G) communication. In addition, since the communication node performs decoding by selecting error patterns in consideration of Hamming weights, complexity may be reduced. Further, since the communication node performs decoding by additionally considering error patterns that may occur commonly between blocks, the decoding performance may be improved.

BRIEF DESCRIPTION OF DRAWINGS

FIG. 10 is a table comparing complexities according to decoding schemes.

DETAILED DESCRIPTION OF THE EMBODIMENTS

Figure 1:
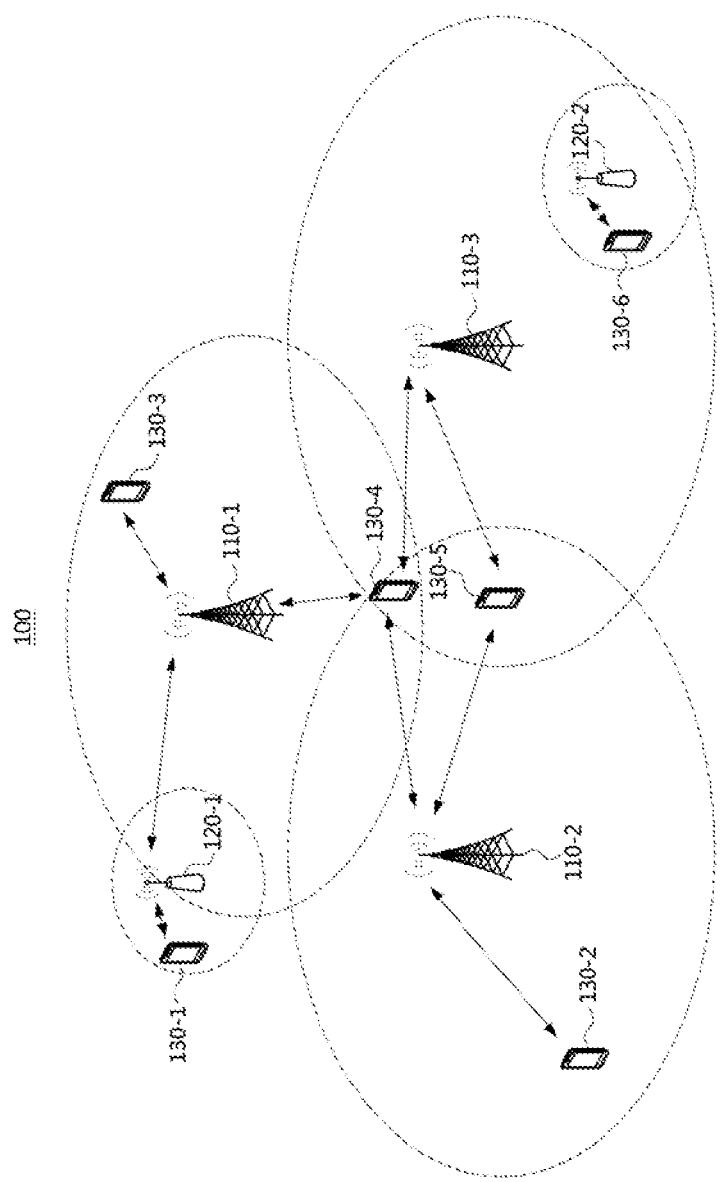
FIG. 1 is a conceptual diagram illustrating a communication network according to an exemplary embodiment of the present disclosure.

Embodiments of the present disclosure are disclosed herein. However, specific structural and functional details disclosed herein are merely representative for purposes of describing embodiments of the present disclosure. Thus, embodiments of the present disclosure may be embodied in many alternate forms and should not be construed as limited to embodiments of the present disclosure set forth herein.

Accordingly, while the present disclosure is capable of various modifications and alternative forms, specific embodiments thereof are shown by way of example in the drawings and will herein be described in detail. It should be understood, however, that there is no intent to limit the present disclosure to the particular forms disclosed, but on the contrary, the present disclosure is to cover all modifications, equivalents, and alternatives falling within the spirit and scope of the present disclosure. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between," "adjacent" versus "directly adjacent," etc.). The terminology used herein is for the purpose of describing particular embodiments only and is not intended to be limiting of the present disclosure. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this present disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, exemplary embodiments of the present disclosure will be described in greater detail with reference to the accompanying drawings. In order to facilitate general understanding in describing the present disclosure, the same components in the drawings are denoted with the same reference signs, and repeated description thereof will be omitted.

Throughout the specification, a network may include, for example, a wireless Internet such as wireless fidelity (WiFi), a mobile Internet such as a wireless broadband Internet (WiBro) or a world interoperability for microwave access (WiMax), a 2G mobile communication network such as a global system for mobile communication (GSM) or a code division multiple access (CDMA), a 3G mobile communication network such as a wideband code division multiple access (WCDMA) or a CDMA2000, a 3.5G mobile communication network such as a high speed downlink packet access (HSDPA) or a high speed uplink packet access (HSUPA), a 4G mobile communication network such as a long term evolution (LTE) network or an LTE-Advanced network, a 5G mobile communication network, or the like.

Throughout the specification, a terminal may refer to a mobile station, a mobile terminal, a subscriber station, a portable subscriber station, a user equipment, an access terminal, or the like, or may include all or a part of functions of the terminal, the mobile station, the mobile terminal, the subscriber station, the portable subscriber station, the user equipment, the access terminal, or the like.

Here, a desktop computer, a laptop computer, a tablet PC, a wireless phone, a mobile phone, a smart phone, a smart watch, a smart glass, an e-book reader, a portable multimedia player (PMP), a portable gaming machine, a navigation device, a digital camera, a digital multimedia broadcasting (DMB) player, a digital audio recorder, a digital audio player, a digital picture recorder, a digital picture player, a digital video recorder, a digital video player, and/or the like, which has communication capability, may be used as the terminal.

Throughout the specification, a base station may refer to an access point, a radio access station, a Node B, an evolved Node B, a base transceiver station, a mobile multi-hop relay (MMR)-BS, or the like, or may include all or a part of functions such as the base station, the access point, the radio access station, the Node B, the evolved Node B, the base transceiver station, the MMR-BS, or the like.

FIG. 1 is a conceptual diagram illustrating a communication network according to an exemplary embodiment of the present disclosure.

Referring to FIG. 1, a communication network 100 may comprise a plurality of communication nodes 110-1, 110-2, 110-3, 120-1, 120-2, 130-1, 130-2, 130-3, 130-4, 130-5, and 130-6. Each of the plurality of communication nodes may support a code division multiple access (CDMA) based communication protocol, a wideband CDMA (WCDMA) based communication protocol, a time division multiple access (TDMA) based communication protocol, a frequency division multiple access (FDMA) based communication protocol, an orthogonal frequency division multiplexing (OFDM) based communication protocol, an orthogonal frequency division multiple access (OFDMA) based communication protocol, a single carrier FDMA (SC-FDMA) based communication protocol, a non-orthogonal multiple access (NOMA) based communication protocol, a space division multiple access (SDMA) based communication protocol, and/or the like. Each of the plurality of communication nodes may have the following structure.

Figure 2:
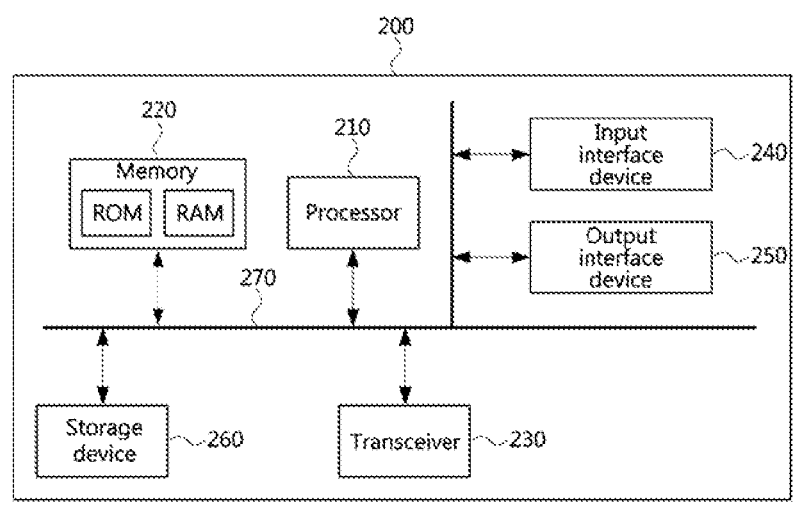
FIG. 2 is a block diagram illustrating a communication node according to an exemplary embodiment of the present disclosure.

FIG. 2 is a block diagram illustrating a communication node according to an exemplary embodiment of the present disclosure.

Referring to FIG. 2, a communication node 200 may comprise at least one processor 210, a memory 220, and a transceiver 230 connected to the network for performing communications. Also, the communication node 200 may further comprise an input interface device 240, an output interface device 250, a storage device 260, and the like. Each component included in the communication node 200 may communicate with each other as connected through a bus 270. However, each component included in the communication node 200 may not be connected to the common bus 270 but may be connected to the processor 210 via an individual interface or a separate bus. For example, the processor 210 may be connected to at least one of the memory 220, the transceiver 230, the input interface device 240, the output interface device 250 and the storage device 260 via a dedicated interface.

The processor 210 may execute a program stored in at least one of the memory 220 and the storage device 260. The processor 210 may refer to a central processing unit (CPU), a graphics processing unit (GPU), or a dedicated processor on which methods in accordance with embodiments of the present disclosure are performed. Each of the memory 220 and the storage device 260 may be constituted by at least one of a volatile storage medium and a non-volatile storage medium. For example, the memory 220 may comprise at least one of read-only memory (ROM) and random access memory (RAM).

Figure 3:
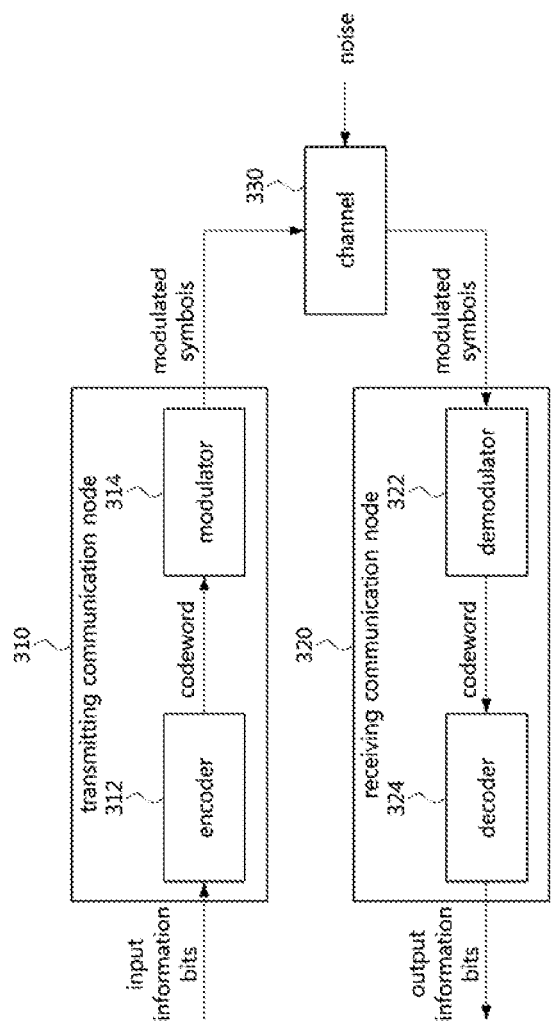
FIG. 3 is a block diagram illustrating a communication system including a transmitting communication node and a receiving communication node.

FIG. 3 is a block diagram illustrating a communication system including a transmitting communication node and a receiving communication node.

Referring to FIG. 3, a communication system may include a transmitting communication node 310 that transmits a signal, a receiving communication node 320 that receives the signal from the transmitting communication node 310, and a channel 330 that allows the signal to be transmitted between the transmitting communication node 310 and the receiving communication node 320. The transmitting communication node 310 may include an encoder 312 and a modulator 314, and the receiving communication node 320 may include a demodulator 322 and a decoder 324.

The transmitting communication node 310 may perform an encoding process and a modulation process before transmitting information bits to the receiving communication node 320. The encoder 312 may perform the encoding process on the information bits. Specifically, the encoder 312 may encode the information bits into a codeword including a plurality of code blocks. In this case, the encoder 312 may divide the information bits into small blocks. The encoder 312 may configure a block group by grouping an arbitrary number of divided blocks. The number of blocks may be determined by a channel environment of a communication network, performances of the transmitting communication node 310 and the receiving communication node 320, and requirements of an application program. The encoder 312 may perform encoding in units of a block group. The encoder 312 may transfer the coded codeword to the modulator 314.

The modulator 314 may generate modulated symbols by modulating the codeword. The modulator 314 may modulate the codeword into symbols using various modulation schemes. The modulation may mean a process of converting a signal into a suitable form, such as intensity, displacement, frequency, or phase of a signal (information) according to the channel characteristics of a transmission medium. The modulation may be a process of converting a signal containing data into a waveform suitable for a channel carrying the signal.

The transmitting communication node 310 may map the modulated symbols to time/frequency resources and transmit a signal generated based on the mapped symbols to the receiving communication node 310 on a channel formed between the transmitting communication node 310 and the receiving communication node 320. Specifically, the signal propagated through antenna(s) of the transmitting communication node 310 may be transmitted to antenna(s) of the receiving communication node 320 through the channel 330. In this case, noises may occur on the channel.

The signal received through the antenna(s) of the receiving communication node 320 may be transferred to the demodulator 322. The demodulator 322 may demodulate the signal according to a demodulation scheme determined according to the channel environment. The demodulator 322 may demodulate the signal to generate the codeword, and may transmit the demodulated codeword to the decoder 324. The decoder 324 having received the demodulated codeword may decode the codeword to obtain output information bits. Hereinafter, the operation of the receiving communication node 320 will be described in detail through FIGS. 4 to 7.

Figure 4:
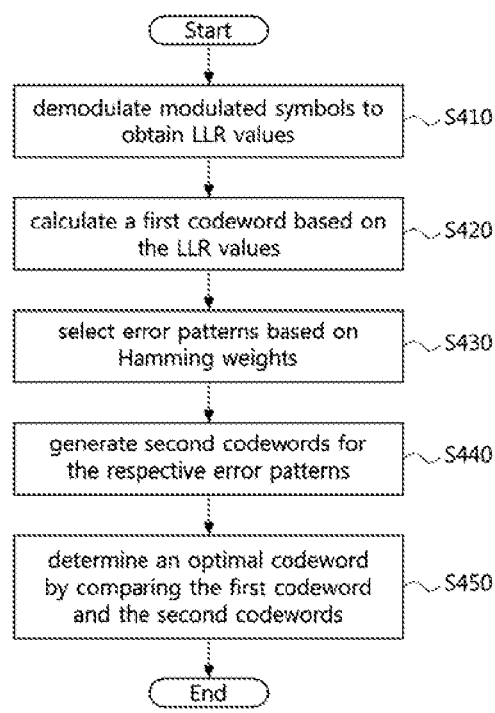
FIG. 4 is a flowchart illustrating an operation method of a receiving communication node.

FIG. 4 is a flowchart illustrating an operation method of a receiving communication node.

Referring to FIG. 4, the receiving communication node 320 may receive the signal from the transmitting communication node 310 and may obtain log likelihood ratio (LLR) values r (S410). More specifically, the receiving communication node 320 may receive the signal from the transmitting communication node 310 and may obtain the LLR values in a process of demodulating the received signal. The LLR values may be soft bit values for the demodulated signal. The soft bit values may be values derived as a result of soft decision, and the result of soft decision may be used as a determination measure indicating how far the symbol is from an exact constellation position. Here, the soft decision may mean that 2 or more quantization levels exist at an output of the demodulator 322. Meanwhile, the size of the LLR may be implemented in various ways in consideration of performance and complexity.

The receiving communication node 320 may calculate a first codeword, which is a predicted codeword value $v_0$, based on the LLR values (S420). The receiving communication node 320 may select LLR values greater than a predetermined threshold (i.e., the receiving communication node 320 may select k most reliable independent positions (MRIPs)). The receiving communication node 320 may select the k MRIPs from all received symbols by performing ordering based on reliability.

The receiving communication node 320 may perform hard decision on the selected k MRIPs. The hard decision may mean that the output of the demodulator 322 is expressed as a binary number of 0 or 1. The hard decision may mean making a definite decision to represent the received symbol as a bit, which is a binary signal.

The receiving communication node 320 may determine a predicted information bit value $u_0$ by performing the hard decision. The receiving communication node 320 may calculate the first codeword that is the predicted codeword value $v_0$ by encoding the predicted information bit value $u_0$.

Figure 5:
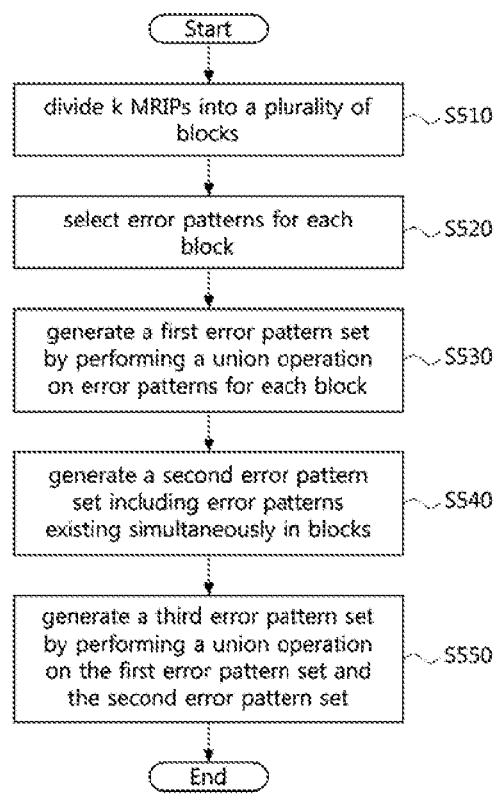
FIG. 5 is a flowchart illustrating a method for a receiving communication node to select error patterns.

The receiving communication node 320 may select error patterns based on Hamming weights among all error patterns (S430). The receiving communication node 320 may compare error patterns and codewords to determine an optimal codeword having the least error. FIG. 5 is a flowchart illustrating a method for the receiving communication node 320 to select error patterns, and FIG. 6 is a conceptual diagram illustrating a method for the receiving communication node 320 to select error patterns.

Figure 6:
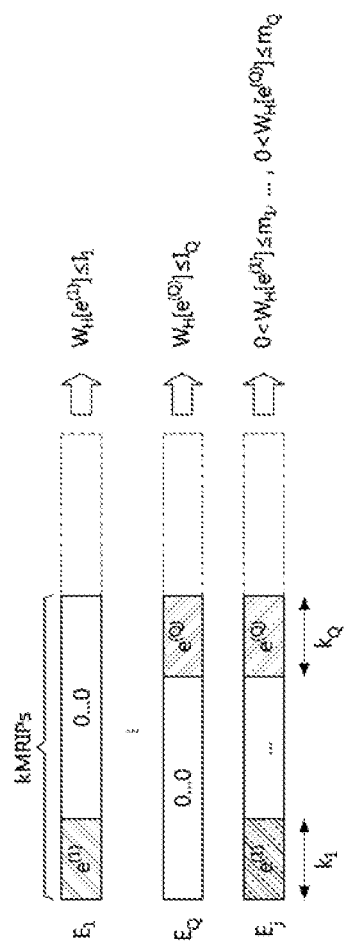
FIG. 6 is a conceptual diagram illustrating a method for a receiving communication node to select error patterns.

Referring to FIGS. 5 and 6, the receiving communication node 320 may divide the LLR values (i.e., k MRIPs) greater than the predetermined threshold value into Q blocks (S510). The receiving communication node 320 may select error patterns $E_q$ to be processed in each block #q constituting the Q blocks. The receiving communication node 320 may select the error patterns in consideration of Hamming weights from among all error patterns, thereby reducing complexity. The receiving communication node 320 may perform OSD having an order of $l_q$ in a block q having a length of $k_q$. In this case, the error patterns $E_a$ existing in each block #q may include all error patterns having Hamming weights equal to or less than $l_q$. The error patterns $E_q$ to be processed in each block #q may be expressed as Equations 1 and 2 below.

$$|E_q| = \sum_{i=1}^{l_q} \binom{k_q}{i}$$ [Equation 1]

$$E_q = \{(0, \ldots, e^q, 0 \ldots, 0) : 0 < w_H[e^q] \le l_q\}, q=1, 2, \ldots, Q$$ [Equation 2]

The receiving communication node 320 may generate a first error pattern set by performing a union operation on the error patterns selected for each block #q (S530). The Hamming weight $l_q$ in the block #q, one of the Q blocks, may be less than or equal to the Hamming weight $l_{q+1}$ in the block #q+1 adjacent to the block #q.

Since the reliability of the first block of the Q blocks may be considered to be the highest, the receiving communication node 320 may optimize the number of error patterns by adjusting the Hamming weights according to the reliability. That is, $l_1 \le l_2 < l_{th}$. Here, $l_{th}$ may be determined according to reliability requirements or error rate requirements. Therefore, the number of error patterns may be reduced compared to the conventional schemes.

The receiving communication node 320 may select error patterns that are commonly present in a plurality of blocks including the block #q, and may generate a second error pattern set based on these error patterns (S540). The receiving communication node 320 may select second error patterns, joint error patterns $E_j$ for each block, in which errors having a Hamming weight of $m_q$ occurs simultaneously, and may generate the second error pattern set. The number of joint error patterns $E_j$ may be expressed as in Equations 3 and 4 below.

$$|E_j| = \prod_{q=1}^{Q} \sum_{i=1}^{m_q} \binom{k_q}{i}$$ [Equation 3]

$$E_j = \{(e^1, \ldots, e^q, \ldots e^Q) : 0 < w_H[e^1] \le m_1, \ldots, 0 < w_H[e^q] \le m_q, \ldots, 0 < w_H[e^Q] \le m_Q\}$$ [Equation 4]

Meanwhile, the Hamming weight $m_q$ in the block #q may be less than or equal to the Hamming weight $m_{q+1}$ in the block #q+1 adjacent to the block #q. In this manner, the receiving communication node 320 may optimize the number of error patterns by adjusting the Hamming weights according to the reliability. That is, $m_q \le m_{q+1} < m_{th}$. Here, $m_{th}$ may be determined according to reliability requirements or error rate requirements. Therefore, the number of error patterns may be reduced compared to the conventional schemes. The receiving communication node 320 may generate a third error pattern set by performing a union operation on the first error pattern set and the second error pattern set, and may select error patterns to be processed based on the third error pattern set (S550). The error pattern to be processed may be expressed as Equation 5 and Equation 6 below.

$$|E| = \sum_{q=1}^{Q} \sum_{i=1}^{l_q} \binom{k_q}{i} + \prod_{q=1}^{Q} \sum_{i=1}^{m_q} \binom{k_q}{i}$$ [Equation 5]

$$E(A) = \{(e^1, \ldots, e^Q) | (w_H[e^1], \ldots, w_H[e^Q]) \in A\}$$ [Equation 6]

Here, a set $A \subset Z^Q$ may represent a combination of Hamming weights of error patterns to be included in testing. Therefore, the error patterns to be processed may be expressed as Equation 7 below.

$$|E| = \sum_{(a_1,\cdots,a_Q)\in A} \prod_{q=1}^{Q} \binom{k_q}{a_q} \quad \text{[Equation 7]}$$

The receiving communication node 320 may provide a decoding method having low complexity and high performance by selecting error patterns from among all error patterns as described above.

As an exemplary embodiment, when Q is 2, the total error patterns to be processed may be expressed as $E=E_1 \cup E_2 \cup E_j$. In other words, the total error patterns to be processed may be a result of performing a union operation on the error patterns $E_1$ existing in a first block #1, the error patterns $E_2$ existing in a second block #2, and the error patterns $E_j$ existing commonly in the first block #1 and the second block #2. Specifically, this may be expressed as in Equation 8.

$$|E| = \sum_{i=1}^{l_1}\binom{k_1}{i} + \sum_{i=1}^{l_2}\binom{k_2}{i} + \sum_{i=1}^{m_1}\binom{k_1}{i} \cdot \sum_{i=1}^{m_2}\binom{k_2}{i} \quad \text{[Equation 8]}$$

Referring back to FIG. 4, the receiving communication node 320 may generate second codewords for the respective selected error patterns (S440). The second codewords may be codewords corresponding to the respective selected error patterns. More specifically, the second codewords may be codewords generated by applying the above-described first codeword to the respective selected error patterns.

Figure 7:
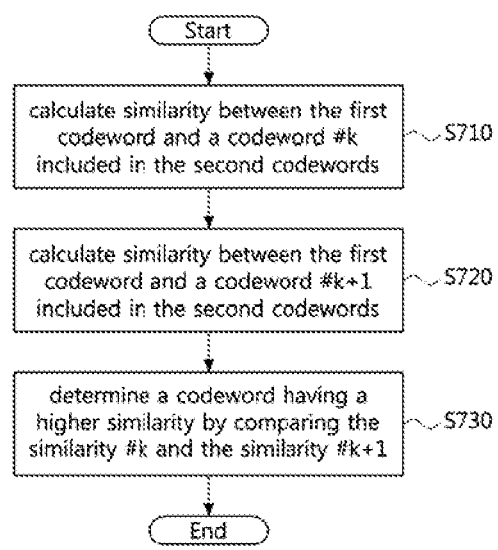
FIG. 7 is a flowchart illustrating a method for a receiving communication node to determine an optimal codeword.

The receiving communication node 320 may compare the second codewords v, which are codewords calculated for the respective error patterns, and the first codeword $v_0$, to determine an optimal codeword $v_{best}$ in which the error is the least (S450). FIG. 7 is a flowchart illustrating a method for the receiving communication node 320 to determine an optimal codeword.

Referring to FIG. 7, the receiving communication node 320 may determine the optimal codeword by comparing similarities between codewords. Specifically, the receiving communication node 320 may determine a similarity according to a decision metric, and determine the optimal codeword based thereon. The receiving communication node 320 may use discrepancy or correlation as the decision metric.

The receiving communication node 320 may calculate a similarity #k between an arbitrary codeword #k included in the second codewords and the first codeword (S710). In addition, the receiving communication node 320 may calculate a similarity #k+1 between an arbitrary codeword #k+1 included in the second codewords and the first codeword (S720). The receiving communication node 320 may compare the similarity #k with the similarity #k+1 to determine a codeword having a higher similarity. The receiving communication node 320 may determine the optimal codeword having the highest similarity by repeating the above operation for all codewords included in the second codewords.

In an exemplary embodiment, when the receiving communication node 320 uses a degree of discrepancy as the decision metric, a degree of discrepancy between the second codeword v (i.e., codeword assuming an arbitrary error pattern) and the first codeword $v_0$ may be measured. This process may be expressed as Equation 9 below.

$$m(y,v) = \sum_{\substack{0 \le i < n \\ v_i \ne v_{0i}}} |y_i| \quad \text{[Equation 9]}$$

When a decision metric m(y,v) obtained by comparing the similarity (i.e., degree of discrepancy) between the first codeword and the arbitrary codeword #k+1 included in the second codewords is less than a decision metric $D_m$ obtained by comparing the similarity (i.e., degree of discrepancy) between the first codeword and the arbitrary codeword #k included in the second codewords, the receiving communication node 320 may update the optimal codeword as the codeword #k+1.

This process may be expressed as Equation 10 below.

$$v_{best}=v \text{ and } D_m=m(y,v), \text{if } m(y,v) \le D_m \quad \text{[Equation 10]}$$

In another exemplary embodiment, when the receiving communication node 320 uses a degree of correlation as the decision metric, a degree of correlation between the second codeword v (i.e., codeword assuming an arbitrary error pattern) and the first codeword $v_0$ may be measured. This process may be expressed as Equation 11 below.

$$m(y,v) = \sum_{0 \le i < n} y_i \cdot (1 - 2v_i) \quad \text{[Equation 11]}$$

When a decision metric m(y,v) obtained by comparing the similarity (i.e., degree of correlation) between the first codeword and the arbitrary codeword #k+1 included in the second codewords is greater than a decision metric $D_m$ obtained by comparing the similarity (i.e., degree of correlation) between the first codeword and the arbitrary codeword #k included in the second codewords, the receiving communication node 320 may update the optimal codeword as the codeword #k+1. This process may be expressed as Equation 12 below.

$$v_{best}=v \text{ and } D_m=m(y,v), \text{if } m(y,v) \le D_m \quad \text{[Equation 12]}$$

The receiving communication node 320 may effectively decode the information bits transmitted from the transmitting communication node 310 based the optimal codeword.

Figure 8:
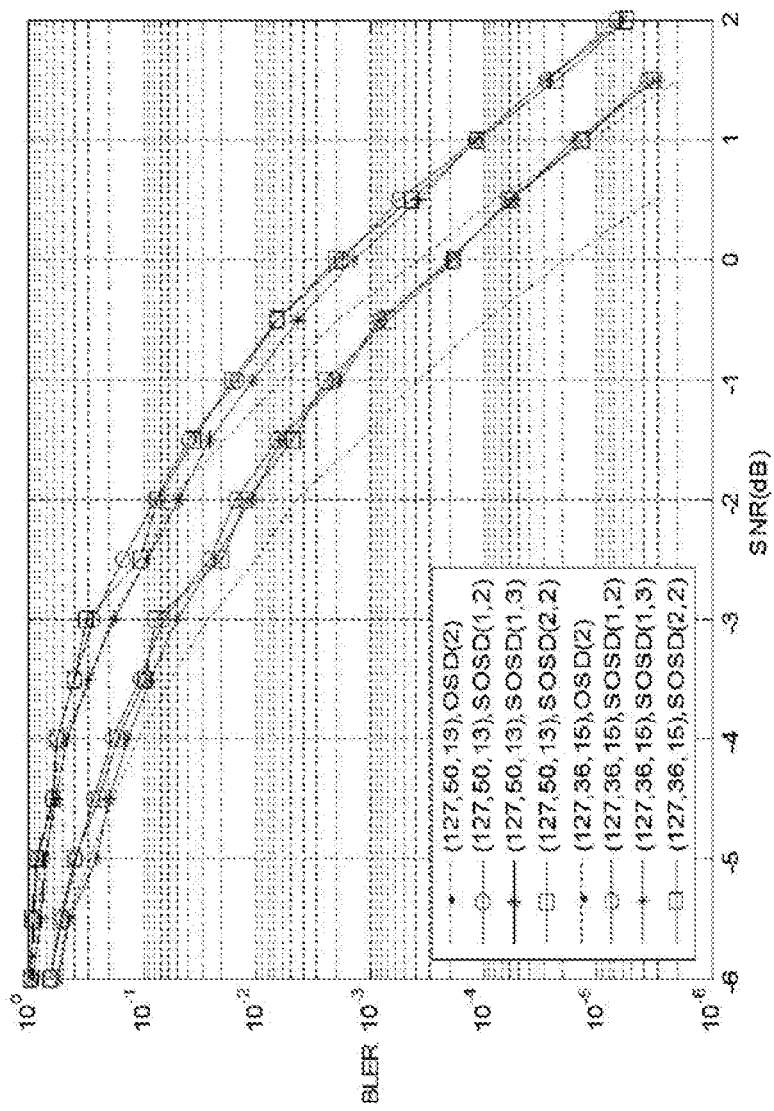
FIGS. 8 and 9 are graphs comparing performances according to decoding schemes.
Figure 9:
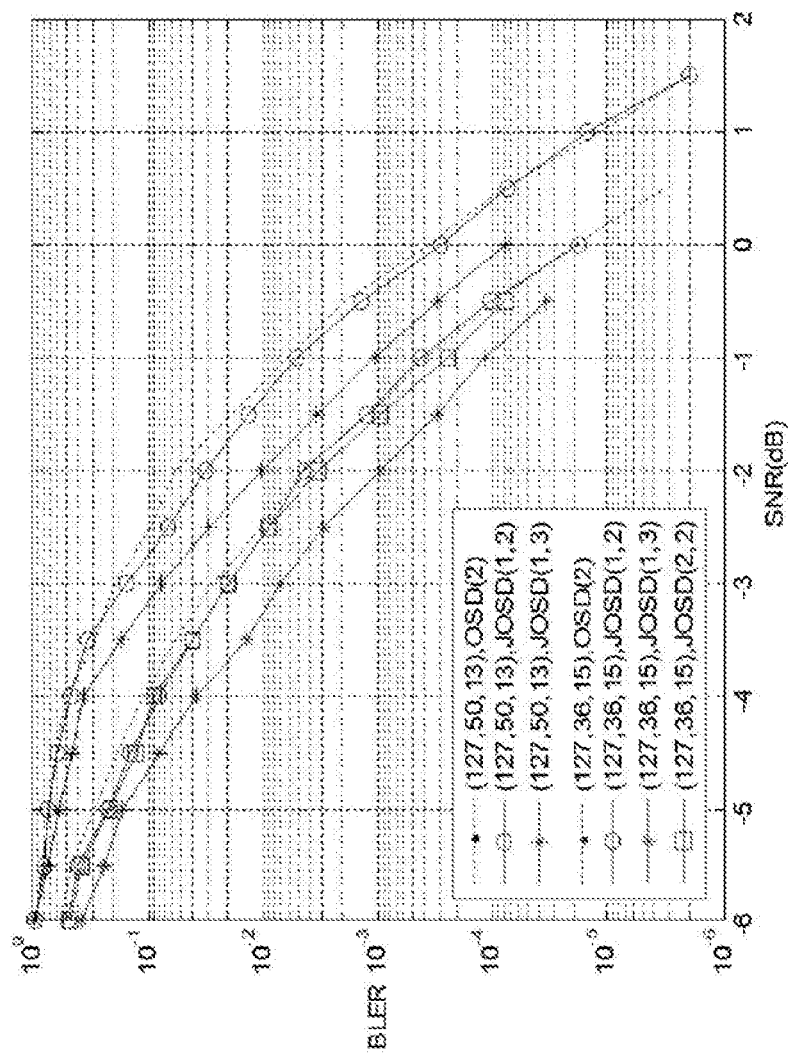

FIGS. 8 and 9 are graphs comparing performances according to decoding schemes, and FIG. 10 is a table comparing complexities according to decoding schemes.

Referring 8 and 9, comparing block error rates (BLERs) of the decoding method (i.e., Joint OSD (JOSD)) according to the present disclosure and the conventional decoding method (i.e., OSD or segmentation-based OSD (SOSD)), it can be seen that the complexity is lower and the performance is improved than the OSD or SOSD method. Further, referring to FIG. 10, comparing the decoding method (i.e., JOSD) according to the present disclosure with the conventional decoding method (OSD or SOSD), it can be seen that the complexity of the decoding method (i.e., JOSD) according to the present disclosure is significantly lower. For example, in FIG. 9, it can be seen that the decoding performance of JOSD (1,2,1,1) for a (127, 50, 13) BCH code is superior to that of OSD (2), and in FIG. 10, it can be seen that the complexity of JOSD (1,2,1,1) is lower than that of OSD (2).

The exemplary embodiments of the present disclosure may be implemented as program instructions executable by a variety of computers and recorded on a computer readable medium. The computer readable medium may include a program instruction, a data file, a data structure, or a combination thereof. The program instructions recorded on the computer readable medium may be designed and configured specifically for the present disclosure or can be publicly known and available to those who are skilled in the field of computer software.

Examples of the computer readable medium may include a hardware device such as ROM, RAM, and flash memory, which are specifically configured to store and execute the program instructions. Examples of the program instructions include machine codes made by, for example, a compiler, as well as high-level language codes executable by a computer, using an interpreter. The above exemplary hardware device can be configured to operate as at least one software module in order to perform the embodiments of the present disclosure, and vice versa.

While the exemplary embodiments of the present disclosure and their advantages have been described in detail, it should be understood that various changes, substitutions and alterations may be made herein without departing from the scope of the present disclosure.

What is claimed is:

1. An operation method of a first communication node in a communication system, the operation method comprising:
    receiving a signal from a second communication node;
    demodulating the signal to obtain log-likelihood ratio (LLR) values;
    calculating a first codeword based on the LLR values;
    selecting error patterns from among all error patterns based on Hamming weights;
    generating second codewords by applying the first codeword to each of the selected error patterns; and
    determining a codeword having a highest similarity to the first codeword among the second codewords as an optimal codeword.

2. The operation method according to claim 1, wherein the calculating of the first codeword comprises:
    selecting LLR values greater than or equal to a threshold among the LLR values; and
    determining a first codeword by performing hard-decision on the selected LLR values.

3. The operation method according to claim 2, wherein the selecting of the error patterns comprises:
    dividing the selected LLR values into Q blocks;
    selecting first error patterns having Hamming weights equal to or less than a first Hamming weight #q, for each arbitrary block #q among the Q blocks; and
    generating a first error pattern set by performing a union operation on the first error patterns selected for each block #q,
    wherein each of Q and q is a natural number.

4. The operation method according to claim 3, wherein the first Hamming weight #q in the block #q is less than or equal to a first Hamming weight #q+1 in a block #q+1 adjacent to the block #q.

5. The operation method according to claim 3, further comprising:
    selecting second error patterns existing commonly in a plurality of blocks including the block #q, and generating a second error pattern set based on the second error patterns; and
    generating a third error pattern set by performing a union operation on the first error pattern set and the second error pattern set,
    wherein the second error patterns have a second Hamming weight #q.

6. The operation method according to claim 5, wherein the second Hamming weight #q in the block #q is less than or equal to a second Hamming weight #q+1 in a block #q+1 adjacent to the block #q.

7. The operation method according to claim 1, wherein the determining of the first codeword comprises:
    calculating a similarity #k between the first codeword and a codeword #k included in the second codewords;
    calculating a similarity #k+1 between the first codeword and a codeword #k+1 included in the second codewords; and
    comparing the similarity #k and the similarity #k+1 to determine a codeword having a higher similarity as an optimal codeword,
    wherein k is a natural number.

8. The operation method according to claim 7, wherein the similarity between the codewords is determined based on a degree of discrepancy between the codewords or a degree of correlation between the codewords.

9. A first communication node in a communication system, the first communication node comprising:
    a processor;
    a memory electronically communicating with the processor; and
    instructions stored in the memory,
    wherein when executed by the processor, the instructions cause the first communication node to:
    receive a signal from a second communication node;
    demodulate the signal to obtain log-likelihood ratio (LLR) values;
    calculate a first codeword based on the LLR values;
    select error patterns from among all error patterns based on Hamming weights;
    generate second codewords by applying the first codeword to each of the selected error patterns; and
    determine a codeword having a highest similarity to the first codeword among the second codewords as an optimal codeword.

10. The first communication node according to claim 9, wherein in the calculating of the first codeword, the instructions further cause the first communication node to:
    select LLR values greater than or equal to a threshold among the LLR values; and
    determine a first codeword by performing hard-decision on the selected LLR values.

11. The first communication node according to claim 10, wherein in the selecting of the error patterns, the instructions further cause the first communication node to:
    divide the selected LLR values into Q blocks;
    select first error patterns having Hamming weights equal to or less than a first hamming weight #q, for each arbitrary block #q among the Q blocks; and
    generate a first error pattern set by performing a union operation on the first error patterns selected for each block #q,
    wherein each of Q and q is a natural number.

12. The first communication node according to claim 11, wherein the first Hamming weight #q in the block #q is less than or equal to a first Hamming weight #q+1 in a block #q+1 adjacent to the block #q.

13. The first communication node according to claim 11, wherein the instructions further cause the first communication node to:
- select second error patterns existing commonly in a plurality of blocks including the block #q, and generate a second error pattern set based on the second error patterns; and
- generate a third error pattern set by performing a union operation on the first error pattern set and the second error pattern set,
- wherein the second error patterns have a second Hamming weight #q.

* * * * *